US012609780B2

(12) United States Patent
Tsai et al.

(10) Patent No.: US 12,609,780 B2
(45) Date of Patent: Apr. 21, 2026

(54) CLOCK SIGNAL SYNTHESIZER FOR ULTRA-WIDEBAND (UWB) TRANSMITTER OR TRANSCEIVER APPLICATIONS

(71) Applicant: QUALCOMM Incorporated, San Diego, CA (US)

(72) Inventors: Tu-I Tsai, Sunnyvale, CA (US); Cheng-Han Wang, San Jose, CA (US); Yi Zeng, San Jose, CA (US); Chan Hong Park, San Jose, CA (US); Sunghwan Kim, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 462 days.

(21) Appl. No.: 18/189,642

(22) Filed: Mar. 24, 2023

(65) Prior Publication Data

US 2024/0322925 A1 Sep. 26, 2024

(51) Int. Cl.
*H04J 3/06* (2006.01)
*H03M 1/12* (2006.01)

(52) U.S. Cl.
CPC ......... *H04J 3/0638* (2013.01); *H03M 1/1255* (2013.01)

(58) Field of Classification Search
CPC .... H04B 1/719; H04B 1/71635; H04B 1/403; H04B 1/7163; B60C 23/0408; B60C 11/246; B60C 11/243; G01S 13/0209; G01M 17/02; H03L 7/183; H03M 1/1255; H04J 3/0638
See application file for complete search history.

(56) References Cited

U.S. PATENT DOCUMENTS

| | | | |
|---|---|---|---|
| 7,082,292 B2 * | 7/2006 | Underbrink ............. | H03J 1/005 |
| | | | 455/259 |
| 7,570,718 B2 * | 8/2009 | Tashiro ............... | H04L 27/0014 |
| | | | 375/376 |
| 9,438,301 B2 * | 9/2016 | Nagaso .................. | H04L 27/20 |
| 2005/0090208 A1 | 4/2005 | Liao | |

(Continued)

FOREIGN PATENT DOCUMENTS

WO       2014078311 A2       5/2014

OTHER PUBLICATIONS

International Search Report and Written Opinion—PCT/US2024/015407—ISA/EPO—Jun. 25, 2024.

(Continued)

*Primary Examiner* — Jung Liu
(74) *Attorney, Agent, or Firm* — Loza & Loza LLP

(57) ABSTRACT

An apparatus, including: an oscillator configured to generate a clock signal; a clock signal synthesizer configured to generate a first clock signal, a second clock signal, and a third clock signal, wherein the first, second, and third clock signals are based on the clock signal; a baseband transmitter configured to generate a transmit baseband digital signal in response to the first clock signal; an ultra-wideband (UWB) pulse digital-to-analog converter (DAC) configured to generate a UWB pulse signal based on the transmit baseband digital signal in response to the second clock signal; and a frequency upconverter configured to frequency upconvert the UWB pulse signal to generate a transmit radio frequency (RF) signal based on the third clock signal.

30 Claims, 5 Drawing Sheets

(56) References Cited

U.S. PATENT DOCUMENTS

| | | | |
|---|---|---|---|
| 2007/0155348 A1* | 7/2007 | Razavi | H04B 1/719 |
| | | | 455/112 |
| 2007/0155350 A1* | 7/2007 | Razavi | H03J 1/0008 |
| | | | 455/146 |
| 2009/0028217 A1 | 1/2009 | Wang et al. | |
| 2010/0062726 A1* | 3/2010 | Zheng | H04B 1/40 |
| | | | 455/74 |
| 2012/0294334 A1* | 11/2012 | Bynam | H04B 1/7176 |
| | | | 375/147 |
| 2016/0327630 A1 | 11/2016 | Mutz et al. | |
| 2017/0096036 A1* | 4/2017 | Guinart | B60C 23/0408 |
| 2020/0062726 A1* | 2/2020 | Becker | C07C 69/734 |
| 2024/0356594 A1* | 10/2024 | Nabki | H04B 7/0479 |
| 2025/0080162 A1* | 3/2025 | Nabki | H04B 1/719 |
| 2025/0150115 A1* | 5/2025 | Nabki | H04L 27/2647 |

OTHER PUBLICATIONS

Kim W., et al., "31.2: A Fully Integrated IEEE 802.15.4/4z-Compliant 6.5-to-SGHz UWB System-on-Chip RF Transceiver Supporting Precision Positioning in a CMOS 28nm Process", International Solid-State Circuits Conference, Feb. 2023, pp. 1-53.
Kim W., et al., "31.2: A Fully Integrated IEEE 802.15.4/4z-Compliant 6.5-to-SGHz UWB System-on-Chip RF Transceiver Supporting Precision Positioning in a CMOS 28nm Process", ISSCC 2023,Session 31, Energy-Efficient Radios for UWB, BMI and IoT Systems, Feb. 2023, 3 Pages.

* cited by examiner

| CH INDEX | $F_{VCO}$ (MHz) | $F_{LO}$ (MHz) | $F_{DOSR}$ (MHz) | $N_2$ | $F_{AOSR}$ (MHz) | $N_5$ | $F_{BB}$ (MHz) | $N_1$ | $F_{REF}$ (MHz) |
|---|---|---|---|---|---|---|---|---|---|
| 13 | 12979.2 | 6489.6 | 3244.8 | 6.5 | 998.4 | 2 | 499.2 | 26 | 38.4 |
| | | | | | | | | 13 | 76.8 |
| 14 | 13977.6 | 6988.8 | 3494.4 | 7 | 998.4 | 2 | 499.2 | 26 | 38.4 |
| | | | | | | | | 13 | 76.8 |
| 15 | 14976 | 7488 | 3744 | 7.5 | 998.4 | 2 | 499.2 | 26 | 38.4 |
| | | | | | | | | 13 | 76.8 |
| 16 | 15974.4 | 7987.2 | 3993.6 | 8 | 998.4 | 2 | 499.2 | 26 | 38.4 |
| | | | | | | | | 13 | 76.8 |

| CH INDEX | $F_{VCO}$ (MHz) | $F_{LO}$ (MHz) | $F_{DOSR}$ (MHz) | $N_2$ | $F_{AOSR}$ (MHz) | $N_5$ | $F_{BB}$ (MHz) | $N_{1A}$ | $N_{1B}$ | $N_6$ | $F_{IREF}$ (MHz) |
|---|---|---|---|---|---|---|---|---|---|---|---|
| 13 | 12979.2 | 6489.6 | 3244.8 | 6.5 | 998.4 | 2 | 499.2 | 26 | BYPS | BYPS | 38.4 |
|  |  |  |  |  |  |  |  | 13 | BYPS | BYPS | 76.8 |
|  |  |  |  |  |  |  |  | 13 | 4 | 5 | 96 |
| 14 | 13977.6 | 6988.8 | 3494.4 | 7 | 998.4 | 2 | 499.2 | 26 | BYPS | BYPS | 38.4 |
|  |  |  |  |  |  |  |  | 13 | BYPS | BYPS | 76.8 |
|  |  |  |  |  |  |  |  | 13 | 4 | 5 | 96 |
| 15 | 14976 | 7488 | 3744 | 7.5 | 998.4 | 2 | 499.2 | 26 | BYPS | BYPS | 38.4 |
|  |  |  |  |  |  |  |  | 13 | BYPS | BYPS | 76.8 |
|  |  |  |  |  |  |  |  | 13 | 4 | 5 | 96 |
| 16 | 15974.4 | 7987.2 | 3993.6 | 8 | 998.4 | 2 | 499.2 | 26 | BYPS | BYPS | 38.4 |
|  |  |  |  |  |  |  |  | 13 | BYPS | BYPS | 76.8 |
|  |  |  |  |  |  |  |  | 13 | 4 | 5 | 96 |

CLOCK SIGNAL SYNTHESIZER FOR ULTRA-WIDEBAND (UWB) TRANSMITTER OR TRANSCEIVER APPLICATIONS

FIELD

Aspects of the present disclosure relate generally to transmitters and/or transceivers, and in particular, to a transmitter or transceiver including a clock signal synthesizer for ultra-wideband (UWB) transmitter or transceiver applications.

BACKGROUND

A transmitter may be configured to transmit a set of pulses (e.g., ultra-wideband (UWB) pulses) based on a set of data. A signal including the set of pulses may be frequency upconverted to generate a transmit radio frequency (RF) signal. The transmit RF signal may then be amplified by a power amplifier (PA), filtered to comply with spectrum mask requirements, and provided to an antenna for wireless transmission. Such transmitter may include phase-locked loops (PLLs) to generate clock or periodic oscillating signals used to generate the transmit RF signal. Reducing the number of components in such transmitters or transceivers is of interest to reduce product size and costs, and conserve power.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: an oscillator configured to generate a clock signal; a clock signal synthesizer configured to generate a first clock signal, a second clock signal, and a third clock signal, wherein the first, second, and third clock signals are based on the clock signal; a baseband transmitter configured to generate a transmit baseband digital signal in response to the first clock signal; an ultra-wideband (UWB) pulse digital-to-analog converter (DAC) configured to generate a UWB pulse signal based on the transmit baseband digital signal in response to the second clock signal; and a frequency upconverter configured to frequency upconvert the UWB pulse signal to generate a transmit radio frequency (RF) signal based on the third clock signal.

Another aspect of the disclosure relates to a method. The method includes generating a clock signal; generating first, second, and third clock signals based on the clock signal; generating a transmit baseband digital signal based on the first clock signal; generating an ultra-wideband (UWB) pulse signal based on the transmit baseband digital signal and the second clock signal; and generating a transmit radio frequency (RF) signal based on the UWB pulse signal and the third clock signal.

Another aspect of the disclosure relates to an apparatus. The apparatus includes means for generating a clock signal; means for generating first, second, and third clock signals based on the clock signal; means for generating a transmit baseband digital signal based on the first clock signal; means for generating an ultra-wideband (UWB) pulse signal based on the transmit baseband digital signal and the second clock signal; and means for generating a transmit radio frequency (RF) signal based on the UWB pulse signal and the third clock signal.

Another aspect of the disclosure relates to an apparatus. The apparatus includes: an oscillator configured to generate a clock signal; a first frequency divider configured to frequency divide the clock signal by a first divider ratio to generate a local oscillator (LO) clock signal; a second frequency divider configured to frequency divide the clock signal or the LO clock signal by a programmable second divider ratio to generate a first oversampling clock signal; a third frequency divider configured to frequency divide the first oversampling clock signal by a third divider ratio to generate a baseband clock signal; and a fourth frequency divider configured to frequency divide the LO clock signal by a fourth divider ratio to generate a second oversampling clock signal.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
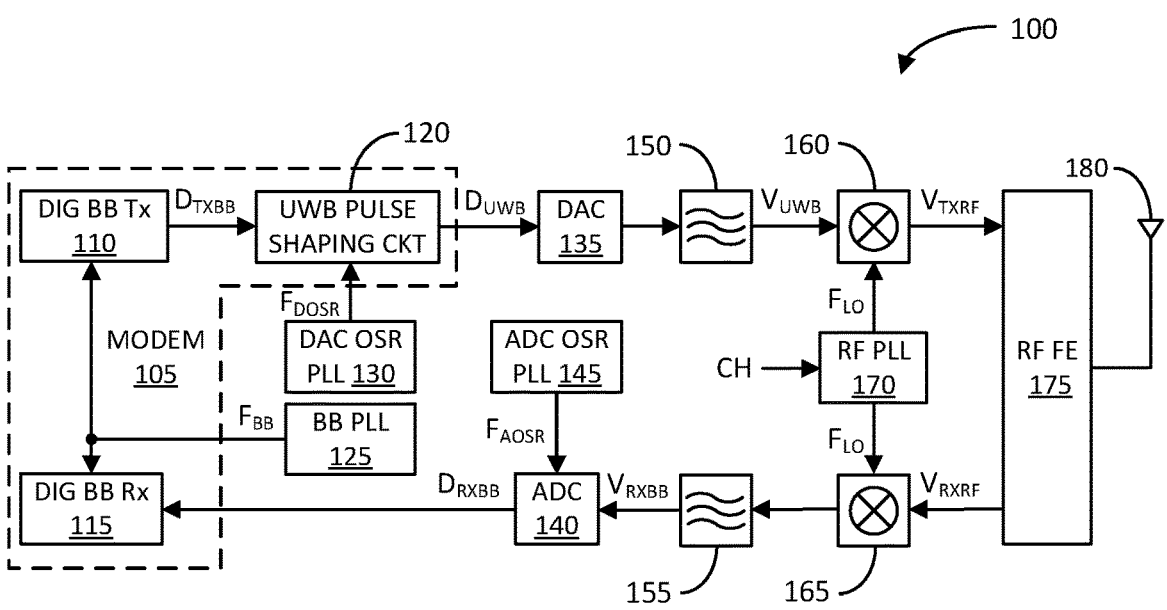
FIG. 1 illustrates a block diagram of an example ultra-wideband (UWB) transceiver in accordance with an aspect of the disclosure.

FIG. 1 illustrates a block diagram of an example ultra-wideband (UWB) transceiver 100 in accordance with an aspect of the disclosure. The UWB transceiver 100 includes a modem 105 including a digital baseband transmitter (DIG BB Tx) 110, a digital baseband receiver (DIG BB Rx) 115, and an ultra-wideband (UWB) pulse shaping circuit 120 (e.g., which may be more generally an upsampling circuit). The UWB transceiver 100 further includes a digital-to-analog converter (DAC) 135, a transmit analog filter 150, and a frequency upconverter 160. Additionally, the UWB transceiver 100 includes a frequency downconverter 165, a receive analog filter 155, and an analog-to-digital converter (ADC) 140. Further, the UWB transceiver 100 includes a baseband phase-locked loop (BB PLL) 125, a digital-to-analog converter oversampling ratio phase-locked loop (DAC OSR PLL) 130, an analog-to-digital converter over-sampling ratio phase-locked loop (ADC OSR PLL) 145, and a radio frequency phase-locked loop (RF PLL) 170. Also, the UWB transceiver 100 includes a radio frequency front-end (RF FE) 175 and at least one antenna 180.

The DIG BB Tx 110 is configured to generate a transmit baseband digital signal $D_{TXBB}$ based on, for example, media access control (MAC), application, and/or other layer data in response to a baseband clock signal $F_{BB}$ generated by the BB PLL 125. The UWB pulse shaping circuit 120 is configured to generate a transmit UWB digital pulse signal $D_{UWB}$ based on the transmit baseband digital signal $D_{TXBB}$ in response to a DAC oversampling clock signal $F_{DOSR}$ generated by the DAC OSR PLL 130. The DAC 135 and the transmit analog filter 150 are collectively configured to generate a transmit UWB analog pulse signal $V_{UWB}$ based on the transmit UWB digital pulse signal $D_{UWB}$. The frequency upconverter 160 is configured to frequency upconvert the transmit UWB analog pulse signal $V_{UWB}$ to generate a transmit RF signal $V_{TXRF}$ based on a local oscillator (LO) clock signal $F_{LO}$ generated by the RF PLL 170, which may be further based on a channel (CH) signal. The RF FE 175 may process the transmit RF signal $V_{TXRF}$ (e.g., power amplify, spectrum mask filter, route via a diplexer/duplexer, and/or other) for wireless transmission to one or more remote wireless devices via the at least one antenna 180.

The RF FE 175 is also configured to process a signal received from one or more remote wireless devices via the at least one antenna 180 (e.g., route via a diplexer/duplexer, channel filter, amplify per a low noise amplifier (LNA), and/or other) to generate a received RF signal $V_{RXRF}$. The frequency downconverter 165 and the receive analog filter 155 are collectively configured to frequency downconvert the received RF signal $V_{RXRF}$ into a received baseband analog signal $V_{RXBB}$ based on the LO clock signal $F_{LO}$ (or another LO clock signal) generated by the RF PLL 170, which may be based on the CH signal. For example, in some transceivers, the same LO clock signal $F_{LO}$ may be used to frequency upconvert and downconvert, such as, in a time division multiplexing (TDD) transceiver system, where the transmission of signals is time multiplexed with the reception of signals. In other transceivers, a first LO clock signal $F_{LO1}$ may be used to frequency upconvert and a second LO clock signal $F_{LO2}$ may be used to frequency downconvert, such as, in a frequency division multiplexing (FDD) system where the transmission and reception of signals occur concurrently using different frequency bands, respectively. The ADC 140 is configured to convert the received baseband analog signal $V_{RXBB}$ into a received baseband digital signal $D_{RXBB}$ in response to an analog-to-digital converter over-sampling ratio (ADC OSR) clock signal $F_{AOSR}$ generated by the ADC OSR PLL 145. The DIG BB Rx 115 is configured to process the received baseband digital signal $D_{RXBB}$ in response to the baseband clock $F_{BB}$ to generate MAC, application, and/or other layer data.

With regard to UWB pulses, UWB connectivity is a short-range, wireless communication protocol that operates with a very high frequency as compared to other short-range wireless communication technologies (e.g., Bluetooth, wide local area network (WLAN), Zigbee, or the like), and uses a relatively wide frequency band (e.g., 500 MHz or greater) as compared to other short-range wireless communication technologies, which makes UWB useable for high-resolution positioning and localization purposes. In some cases, UWB technology may be used for location discovery, device ranging, or the like. In some cases, a UWB transmitter (e.g., the transceivers 100, 200, and 300, and transmitter 800) may transmit numerous pulses across the wide spectrum frequency, and a corresponding UWB receiver (e.g., located at another UWB-enabled device) may translate the pulses into data.

A challenge of the UWB transceiver 100 is that multiple PLLs each occupying significant area and consuming power are required to generate the clock signals for transmission and reception of signals. These clock signal generators include the BB PLL 125, the DAC OSR PLL 130, the ADC OSR PLL 145, and the RF PLL 170. Each of these clock signal generators may consume significant power. For instance, in one example implementation, the power consumption of each of the BB PLL 125, DAC OSR PLL 130, and the ADC OSR PLL 145 may be between 5-20% of the total transceiver power consumption, while the RF PLL 170 may be 20-40% of the total transceiver power consumption. Thus, the UWB transceiver 100 may consume significant power in generating clock signals for signal transmission and/or reception. Furthermore, the PLLs 125, 130, 145, and 170 collectively may occupy significant circuit, such as integrated circuit (IC), area or footprint, which may increase the costs of products incorporating the UWB transceiver 100.

Figure 2:
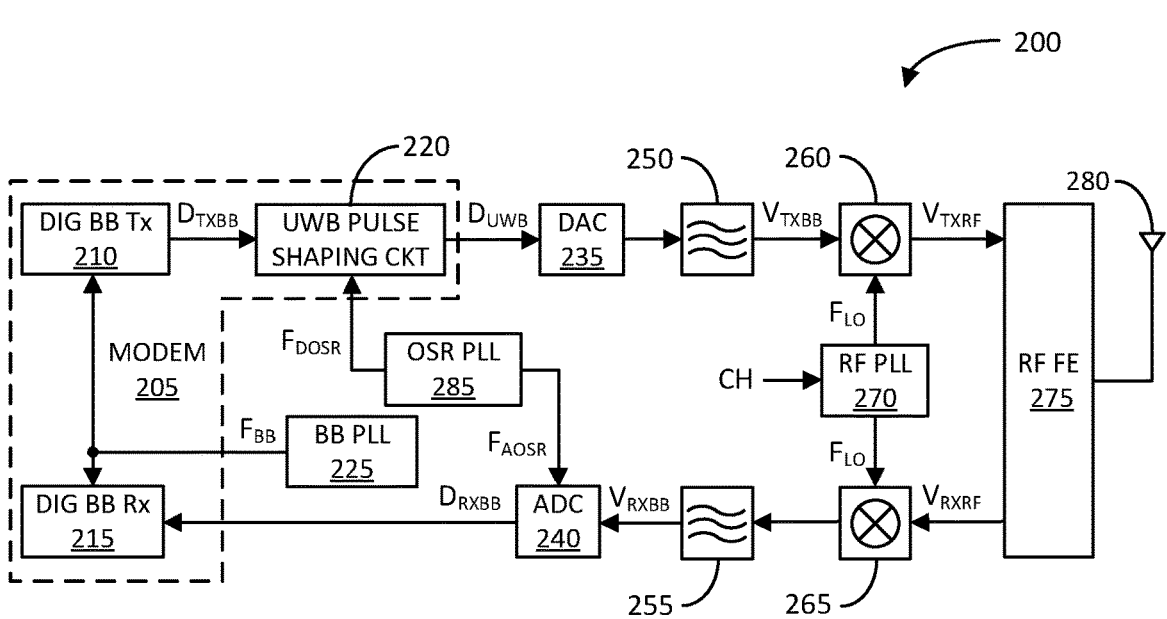
FIG. 2 illustrates a block diagram of another example ultra-wideband (UWB) transceiver in accordance with another aspect of the disclosure.

FIG. 2 illustrates a block diagram of another example ultra-wideband (UWB) transceiver 200 in accordance with another aspect of the disclosure. The UWB transceiver 200 is similar to UWB transceiver 100, and includes many of the same/similar elements identified with the same reference numbers with the exception that the most significant digital is a "2" for UWB transceiver 200 instead of "1" as in UWB transceiver 100. These same/similar elements have been discussed in detail with reference to UWB transceiver 100.

The UWB transceiver 200 differs from UWB transceiver 100 in that UWB transceiver 200 includes an integrated digital-to-analog converter (DAC) and analog-to-digital converter (ADC) oversampling phase-locked loop (PLL) ("OSR PLL") 285 configured to generate the DAC OSR clock signal $F_{DOSR}$ for the UWB pulse shaping circuit 220 (e.g., more generally an upsampling circuit) and the ADC OSR clock signal $F_{AOSR}$ for the ADC 240, as these clock signals may have the same or similar frequencies. For example, both the DAC oversampling clock signal $F_{DOSR}$ and the ADC oversampling clock signal $F_{AOSR}$ may be related (e.g., in frequency) to or derived from a voltage controlled oscillator (VCO) clock signal generated by the OSR PLL 285. For example, it may be desirable for the frequency of the ADC oversampling clock signal $F_{AOSR}$ to be two (2) times or more the frequency of the DAC oversampling clock signal $F_{DOSR}$.

Thus, an advantage of the UWB transceiver 200 over UWB transceiver 100 is that it may consume less power and circuit or IC footprint due to having three (3) PLLs versus four (4) PLLs. For instance, in one example implementation, the BB PLL 225 and OSR PLL 285 in combination may consume 10-40% of the total transceiver power while the RF PLL 270 may consume 20-40% of the total transceiver power. Thus, comparing both example implementations 100 and 200, the UWB transceiver 200 may have an improved power efficiency advantage and the IC footprint advantage may be significant.

Figure 3:
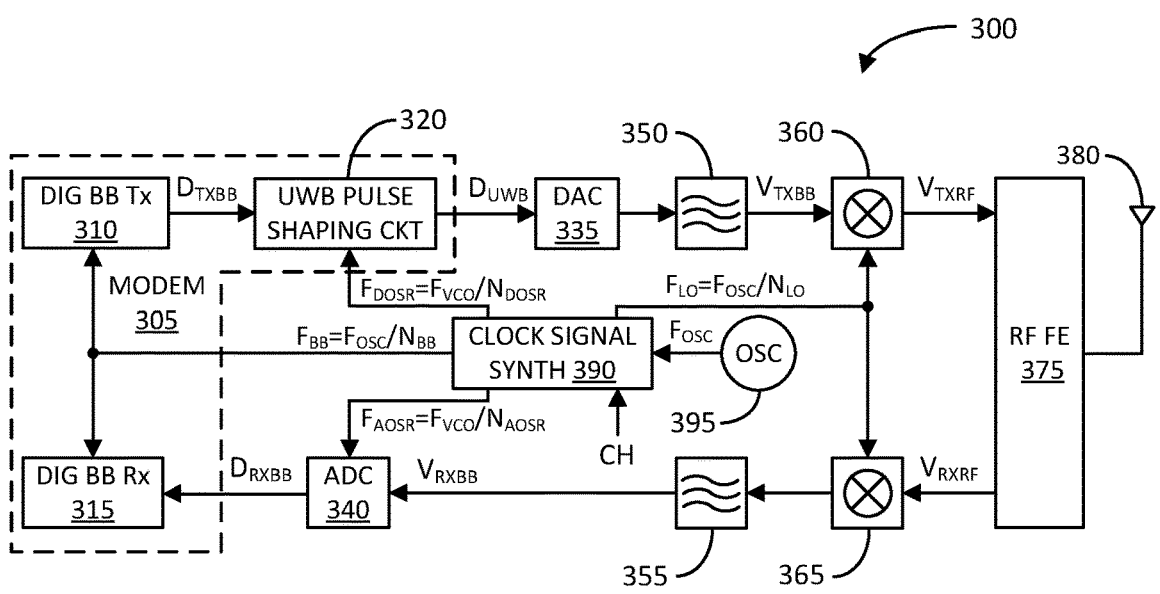
FIG. 3 illustrates a block diagram of another example ultra-wideband (UWB) transceiver in accordance with another aspect of the disclosure.

FIG. 3 illustrates a block diagram of another example ultra-wideband (UWB) transceiver 300 in accordance with another aspect of the disclosure. The UWB transceiver 300 is similar to UWB transceivers 100 and 200, and includes many of the same/similar elements identified with the same reference numbers with the exception that the most significant digital is a "3" for UWB transceiver 300 instead of "1" and "2" as in UWB transceivers 100 and 200, respectively. These same/similar elements have been discussed in detail with reference to UWB transceivers 100 and 200.

The UWB transceiver 300 differs from UWB transceivers 100 and 200 in that UWB transceiver 300 includes a clock signal synthesizer 390 configured to generate the baseband clock signal $F_{BB}$ for the DIG BB Tx 310 and the DIG BB Rx 315, the DAC oversampling clock signal $F_{DOSR}$ for the UWB pulse shaping circuit 320, the ADC oversampling clock signal $F_{AOSR}$ for the ADC 340, and the LO clock signal $F_{LO}$ for the frequency upconverter 360 and frequency downconverter 365 based on a clock signal $F_{OSC}$ generated by an oscillator 395. For example, the baseband clock signal $F_{BB}$, the DAC oversampling clock signal $F_{DOSR}$, the ADC oversampling clock signal $F_{AOSR}$, and the LO clock signal $F_{LO}$ may be related (e.g., in frequency) to or derived from the clock signal $F_{OSC}$, which may be a clock signal generated by a voltage controlled oscillator (VCO), a current control oscillator (ICO), a digital control oscillator (DCO), or other. For example, the frequency of the baseband clock signal $F_{BB}$ may be the frequency of the clock signal $F_{OSC}$ divided by a first effective divider ratio $N_{BB}$ (e.g., $F_{BB}=F_{OSC}/N_{BB}$). Similarly, the frequency of the DAC oversampling clock signal $F_{DOSR}$ may be the frequency of the clock signal $F_{OSC}$ divided by a second effective divider ratio $N_{DOSR}$ (e.g., $F_{DOSR}=F_{OSC}/N_{DOSR}$). In a like manner, the frequency of the ADC oversampling clock signal $F_{AOSR}$ may be the frequency of the clock signal $F_{OSC}$ divided by a third effective divider ratio $N_{AOSR}$ (e.g., $F_{AOSR}=F_{OSC}/N_{AOSR}$). Also, the frequency of the LO clock signal $F_{LO}$ may be the frequency of the clock signal $F_{OSC}$ divided by a fourth effective divider ratio $N_{LO}$ (e.g., $F_{LO}=F_{OSC}/N_{LO}$). The terms $N_{BB}$, $N_{DOSR}$, $N_{AOSR}$, and $N_{LO}$ are each referred to as a divider ratio because it is the ratio of the frequency of an input clock signal to the frequency of an output clock signal.

As discussed further with reference to an example implementation of the clock signal synthesizer 390, the first, second, third, and fourth divider ratios $N_{BB}$, $N_{DOSR}$, $N_{AOSR}$, and $N_{LO}$ are in descending magnitude order (e.g., $N_{BB}>N_{DOSR}>N_{AOSR}>N_{LO}$) so that the frequencies of the clock signals $F_{BB}$, $F_{DOSR}$, $F_{AOSR}$, and $F_{LO}$ are in ascending magnitude order (e.g., $F_{BB}<F_{DOSR}<F_{AOSR}<F_{LO}$).

Thus, an advantage of the UWB transceiver 300 is that it may consume significantly less power and occupy significantly less circuit or IC footprint. For instance, in one example implementation, the clock signal synthesizer 390 may consume 15-40% of the total transceiver power in generating clock signals for the UWB transceiver 300. Thus, comparing UWB transceiver implementation 300 to the implementations 100 and 200, the UWB transceiver 300 may have a significant power efficiency advantage, but also has a significant IC footprint advantage.

Figure 4A:
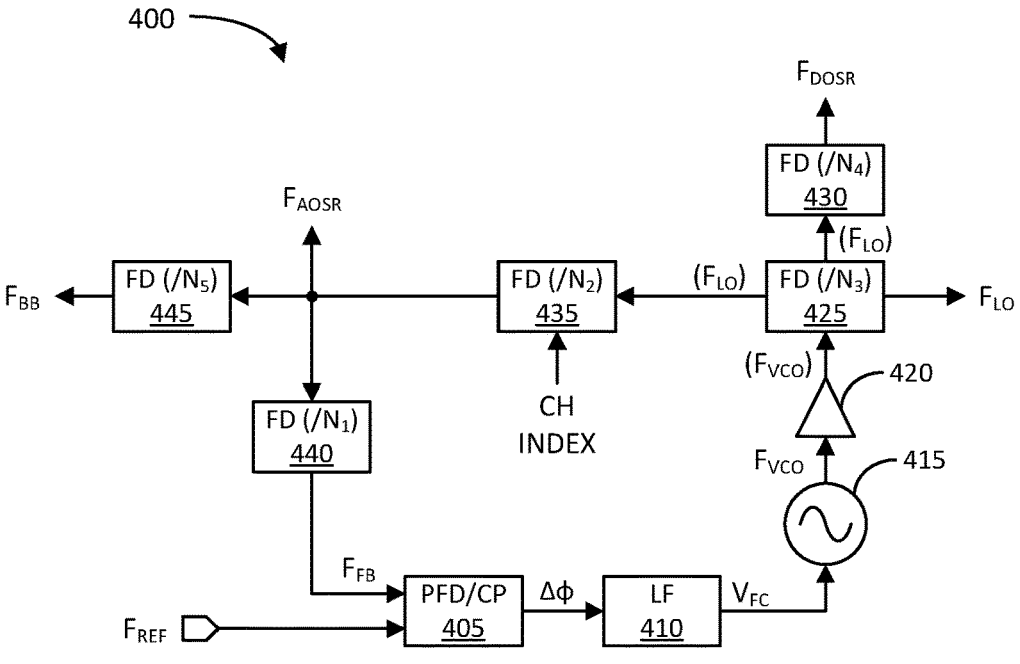
FIG. 4A illustrates a block diagram of an example clock signal synthesizer in accordance with another aspect of the disclosure.

FIG. 4A illustrates a block diagram of an example clock signal synthesizer 400 in accordance with another aspect of the disclosure. The clock signal synthesizer 400 may be an example detailed implementation of the clock signal synthesizer 390 of UWB transceiver 300. In particular, the clock signal synthesizer 400 includes a phase-frequency detector/charge pump (PFD/CP) 405, a loop filter (LF) 410, a voltage controlled oscillator (VCO) 415, a buffer 420, a first frequency divider (FD) 440, a second frequency divider (FD) 435, a third frequency divider (FD) 425, a fourth frequency divider (FD) 430, and a fifth frequency divider (FD) 445. The PFD/CP 405, the LF 410, the VCO 415, the buffer 420, the third frequency divider (FD) 425, the second frequency divider (FD) 435, and the first frequency divider (FD) 440 are part of a phase-locked loop (PLL) of the clock signal synthesizer 400. The PLL may be implemented as a digital PLL, an analog PLL, a hybrid digital-analog PLL, a delay-locked loop (DLL), or other phase locking control circuit.

The PFD/CP 405 is configured to generate a phase difference signal $\Delta\phi$ based on a phase/frequency difference between a reference clock signal $F_{REF}$ and a phase-locked loop (PLL) feedback clock signal $F_{FB}$. Although, for ease of description, the PFD/CP 405 is described and represented as a single element, it shall be understood that the PFD/CP 405 may include a PFD separate from a CP (e.g., the CP follows the PFD). The loop filter (LF) 410 is configured to filter the phase difference signal $\Delta\phi$ to generate a VCO frequency control signal $V_{FC}$. The VCO 415 is configured to generate a VCO clock signal $F_{VCO}$ based on the frequency control signal $V_{FC}$. The buffer 420 is configured to buffer the VCO 415 while also outputting the VCO clock signal $F_{VCO}$. As previously discussed, the VCO 415 may alternatively be implemented as a current controlled oscillator (ICO) or digital controlled oscillator (DCO).

The third frequency divider 425 is configured to frequency divide the VCO clock signal $F_{VCO}$ by a third divider ratio $N_3$ to generate, for example, the LO clock signal $F_{LO}$ of the UWB transceiver 300 (e.g., $F_{LO}=F_{VCO}/N_3$). The fourth frequency divider 430 is configured to frequency divide the LO clock signal $F_{LO}$ by a fourth divider ratio $N_4$ to generate, for example, the DAC OSR clock signal $F_{DOSR}$ of the UWB transceiver 300 (e.g., $F_{DOSR}=F_{LO}/N_4$). The second frequency divider 435 is configured to frequency divide the LO clock signal $F_{LO}$ by a programmable second divider ratio $N_2$ to generate, for example, the ADC OSR clock signal $F_{AOSR}$ (e.g., $F_{AOSR}=F_{LO}/N_2$). The second frequency divider 435 may set the programmable second divider ratio $N_2$ based on a channel (CH) index signal, as discussed in more detail further herein. The fifth frequency divider 445 is configured to frequency divide the ADC OSR clock signal $F_{AOSR}$ by a fifth frequency divider $N_5$ to generate the baseband clock signal $F_{BB}$ (e.g., $F_{BB}=F_{AOSR}/N_5$). The first frequency divider 440 is configured to frequency divide the ADC oversampling clock signal $F_{AOSR}$ by a first divider ratio $N_1$ to generate, for example, the PLL feedback clock signal $F_{FB}$ (e.g., $F_{FB}=F_{AOSR}/N_1$).

In this example implementation, the first effective divider ratio $N_{BB}$ associated with generating the baseband clock signal $F_{BB}$ is the product of the fifth divider ratio $N_5$, the second divider ratio $N_2$ and the third divider ratio $N_3$ (e.g., $N_{BB}=N_5*N_2*N_3$). Thus, the frequency of the baseband clock signal $F_{BB}$ is the frequency of the VCO clock signal $F_{VCO}$ divided by the product of the fifth, second and third divider ratios $N_5$, $N_2$ and $N_3$ (e.g., $F_{BB}=F_{VCO}/N_{BB}=F_{VCO}/(N_5*N_2*N_3)$). Similarly, the second effective divider ratio $N_{DOSR}$ associated with generating the DAC OSR clock signal $F_{DOSR}$ is the product of the third divider ratio $N_3$ and the fourth divider ratio $N_4$ (e.g., $N_{DOSR}=N_3*N_4$). Thus, the frequency of the DAC OSR clock signal $F_{DOSR}$ is the frequency of the VCO clock signal $F_{VCO}$ divided by the product of the third and fourth divider ratios $N_3$ and $N_4$ (e.g., $F_{DOSR}=F_{VCO}/N_{DOSR}=F_{VCO}/(N_3*N_4)$). The third effective divider ratio $N_{AOSR}$ associated with generating the ADC OSR clock signal $F_{AOSR}$ is the product of the second divider ratio $N_2$ and the third divider ratio $N_3$ (e.g., $N_{AOSR}=N_2*N_3$). Thus, the frequency of the ADC OSR clock signal $F_{AOSR}$ is the frequency of the VCO clock signal $F_{VCO}$ divided by the product of the second and third divider ratios $N_2$ and $N_3$ (e.g., $F_{AOSR}=F_{VCO}/N_{AOSR}=F_{VCO}/(N_2*N_3)$). In this example, the fourth effective divider ratio $N_{LO}$ associated with generating the LO clock signal $F_{LO}$ is the same as the third divider ratio $N_3$. Thus, the frequency of the LO clock signal $F_{LO}$ is the frequency of the VCO clock signal $F_{VCO}$ divided by the third divider ratio $N_3$ (e.g., $F_{LO}=F_{VCO}/N_{LO}=F_{VCO}/N_3$).

It shall be understood that the fifth frequency divider 445 may be optional, and in one aspect or implementation, the clock signal synthesizer 400 may generate the ADC and DAC oversampling clock signals $F_{AOSR}$ and $F_{DOSR}$, and the LO clock signal $F_{LO}$. Furthermore, as shown in FIG. 4A, in accordance with another aspect or implementation, the DAC oversampling clock signals $F_{AOSR}$ and $F_{DOSR}$, the LO clock signal $F_{LO}$, and optionally, the baseband clock signal $F_{BB}$ may be generated from a single loop PLL (e.g., a single loop digital PLL, an analog PLL, a hybrid digital-analog PLL, a delay-locked loop (DLL), or other phase locking control circuit).

Figures 4B, 5:
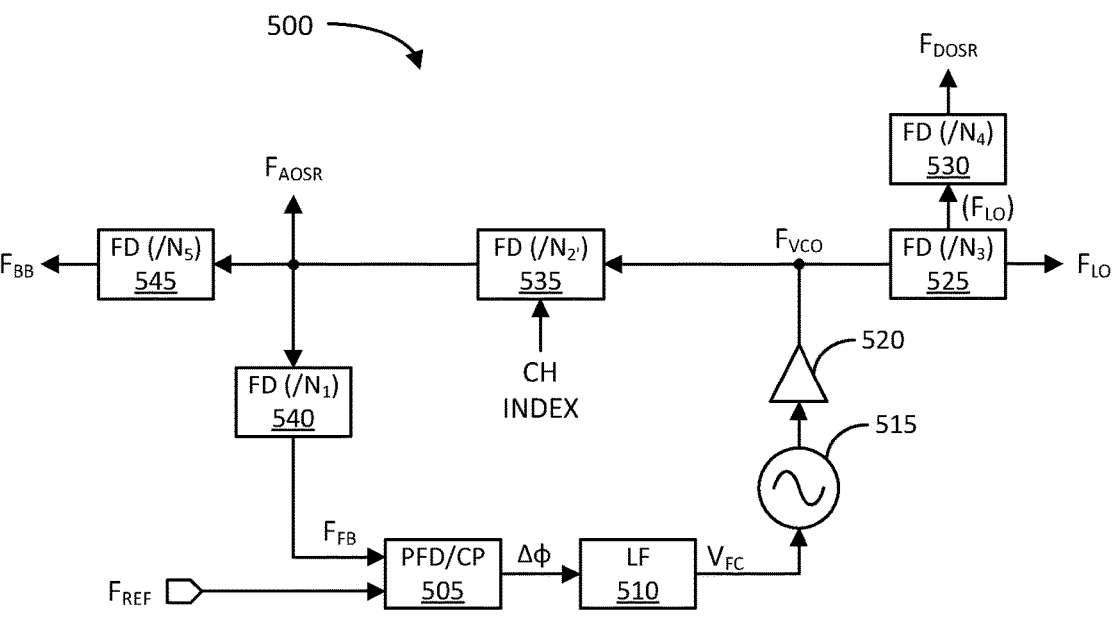
FIG. 4B illustrates a table depicting example clock signal frequencies and parameters associated with the clock signal synthesizer of FIG. 4A in accordance with another aspect of the disclosure.
FIG. 5 illustrates a block diagram of another example clock signal synthesizer in accordance with another aspect of the disclosure.

FIG. 4B illustrates a table depicting example clock frequencies and parameters associated with the clock signal synthesizer 400 in accordance with another aspect of the disclosure. The table is divided into 10 columns, which identify, from left-to-right, a channel index, the frequency of the VCO clock signal $F_{VCO}$ in mega Hertz (MHz), the frequency of the LO clock signal $F_{LO}$ in MHz, the frequency of the DAC OSR clock signal $F_{DOSR}$ in MHz, the second divider ratio $N_2$, the frequency of the ADC OSR clock signal $F_{AOSR}$ in MHz, the fifth divider ratio $N_5$, the frequency of the baseband clock signal $F_{BB}$ in MHz, the first divider ratio $N_1$, and the frequency of the reference clock signal $F_{REF}$, respectively. The table is also divided into four (4) rows (excluding the header row) to specify the aforementioned frequency and divider ratio parameters for a set of channel indices 13-16, respectively.

Considering channel index 13, the frequency of the VCO clock signal $F_{VCO}$ may be 12979.2 MHz (e.g., $F_{VCO}=N_1*N_2*N_3*F_{REF}$), the frequency of the LO clock signal $F_{LO}$ may be 6489.6 MHz (e.g., $F_{LO}=F_{VCO}/N_3$, where $N_3$ is equal to two (2)), the frequency of the DAC OSR clock signal $F_{DOSR}$ may be 3244.8 MHz (e.g., $F_{DOSR}=F_{VCO}/(N_3*N_4)$, where $N_4$ is equal to two (2)), the programmable second divider ratio $N_2$ may be 6.5, the frequency of the ADC OSR clock signal $F_{AOSR}$ may be 998.4 MHz (e.g., $F_{AOSR}=F_{VCO}/(N_2*N_3)$, the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$), the first divider ratio $N_1$ may be 26 for a reference clock signal $F_{REF}$ with a frequency of 38.4 MHz, and the first divider ratio $N_1$ may be 13 for a reference clock signal $F_{REF}$ with a frequency of 76.8 MHz.

Considering channel index 14, the frequency of the VCO clock signal $F_{VCO}$ may be 13977.6 MHz (e.g., $F_{VCO}=N_1*N_2*N_3*F_{REF}$), the frequency of the LO clock signal $F_{LO}$ may be 6988.8 MHz (e.g., $F_{LO}=F_{VCO}/N_3$, where $N_3$ is equal to two (2)), the frequency of the DAC OSR clock signal $F_{DOSR}$ may be 3494.4 MHz (e.g., $F_{DOSR}=F_{VCO}/(N_3*N_4)$, where $N_4$ is equal to two (2)), the programmable second divider ratio $N_2$ may be seven (7), the frequency of the ADC OSR clock signal $F_{AOSR}$ may be 998.4 MHz (e.g., $F_{AOSR}=F_{VCO}/(N_2*N_3)$, the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$), the first divider ratio $N_1$ may be 26 for a reference clock signal $F_{REF}$ with a frequency of 38.4 MHz, and the first divider ratio $N_1$ may be 13 for a reference clock signal $F_{REF}$ with a frequency of 76.8 MHz.

Considering channel index 15, the frequency of the VCO clock signal $F_{VCO}$ may be 14976 MHz (e.g., $F_{VCO}=N_1*N_2*N_3*F_{REF}$), the frequency of the LO clock signal $F_{LO}$ may be 7488 MHz (e.g., $F_{LO}=F_{VCO}/N_3$, where $N_3$ is equal to two (2)), the frequency of the DAC OSR clock signal $F_{DOSR}$ may be 3744 MHz (e.g., $F_{DOSR}=F_{VCO}/(N_3*N_4)$, where $N_4$ is equal to two (2)), the programmable second divider ratio $N_2$ may be 7.5, the frequency of the ADC OSR clock signal $F_{AOSR}$ may be 998.4 MHz (e.g., $F_{AOSR}=F_{VCO}/(N_2*N_3)$, the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$), the first divider ratio $N_1$ may be 26 for a reference clock signal $F_{REF}$ with a frequency of 38.4 MHz, and the first divider ratio $N_1$ may be 13 for a reference clock signal $F_{REF}$ with a frequency of 76.8 MHz.

Considering channel index 16, the frequency of the VCO clock signal $F_{VCO}$ may be 15974.4 MHz (e.g., $F_{VCO}=N_1*N_2*N_3*F_{REF}$), the frequency of the LO clock signal $F_{LO}$ may be 7987.2 MHz (e.g., $F_{LO}=F_{VCO}/N_3$, where $N_3$ is equal to two (2)), the frequency of the DAC OSR clock signal $F_{DOSR}$ may be 3993.6 MHz (e.g., $F_{DOSR}=F_{VCO}/(N_3*N_4)$, where $N_4$ is equal to two (2)), the programmable second divider ratio $N_2$ may be eight (8), the frequency of the ADC OSR clock signal $F_{AOSR}$ may be 998.4 MHz (e.g., $F_{AOSR}=F_{VCO}/(N_2*N_3)$, the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$), the first divider ratio $N_1$ may be 26 for a reference clock signal $F_{REF}$ with a frequency of 38.4 MHz, and the first divider ratio $N_1$ may be 13 for a reference clock signal $F_{REF}$ with a frequency of 76.8 MHz.

FIG. 5 illustrates a block diagram of another example clock signal synthesizer 500 in accordance with another aspect of the disclosure. The clock signal synthesizer 500 is similar to clock signal synthesizer 400, and includes many of the same/similar elements identified with the same reference numbers with the exception that the most significant digital is a "5" for clock signal synthesizer 500 instead of "4" as in clock signal synthesizer 400. These same/similar elements have been discussed in detail with reference to clock signal synthesizer 400.

The clock signal synthesizer 500 differs from clock signal synthesizer 400 in that the third frequency divider 525 is outside of the phase-locked loop (PLL). Because of this difference, the frequency relationships of the clock signals may be different. For example, the third frequency divider 525 is configured to frequency divide the VCO clock signal $F_{VCO}$ by a third divider ratio $N_3$ to generate, for example, the LO clock signal $F_{LO}$ of the UWB transceiver 300 (e.g., $F_{LO}=F_{VCO}/N_3$). The fourth frequency divider 530 is configured to frequency divide the LO clock signal $F_{LO}$ by a fourth divider ratio $N_4$ to generate, for example, the DAC OSR clock signal $F_{DOSR}$ of the UWB transceiver 300 (e.g., $F_{DOSR}=F_{LO}/N_4$). The second frequency divider 535 is configured to frequency divide the VCO clock signal $F_{VCO}$ by a programmable second divider ratio $N_2$ to generate, for example, the ADC OSR clock signal $F_{AOSR}$ (e.g., $F_{AOSR}=F_{VCO}/N_2$). Similarly, the second frequency divider 535 may set the programmable second divider ratio $N_2$ based on a channel (CH) index signal, as previously discussed. The fifth frequency divider 545 is configured to frequency divide the ADC OSR clock signal $F_{AOSR}$ by a fifth frequency divider $N_5$ to generate the baseband clock signal $F_{BB}$ (e.g., $F_{BB}=F_{AOSR}/N_5$). The first frequency divider 540 is configured to frequency divide the ADC oversampling clock signal $F_{AOSR}$ by a first divider ratio $N_1$ to generate, for example, the PLL feedback clock signal $F_{FB}$ (e.g., $F_{FB}=F_{AOSR}/N_1$).

In this example implementation, the first effective divider ratio $N_{BB}$ associated with generating the baseband clock signal $F_{BB}$ is the product of the fifth divider ratio $N_5$ and the second divider ratio $N_2$ (e.g., $N_{BB}=N_5*N_2$). Thus, the frequency of the baseband clock signal $F_{BB}$ is the frequency of the VCO clock signal $F_{VCO}$ divided by the product of the fifth and second divider ratios $N_5$ and $N_2$ (e.g., $F_{BB}=F_{VCO}/N_{BB}=F_{VCO}/(N_5*N_2)$). Similarly, the second effective divider ratio $N_{DOSR}$ associated with generating the DAC OSR clock signal $F_{DOSR}$ is the product of the third divider ratio $N_3$ and the fourth divider ratio $N_4$ (e.g., $N_{DOSR}=N_3*N_4$). Thus, the frequency of the DAC OSR clock signal $F_{DOSR}$ is the frequency of the VCO clock signal $F_{VCO}$ divided by the product of the third and fourth divider ratios $N_3$ and $N_4$ (e.g., $F_{DOSR}=F_{VCO}/N_{DOSR}=F_{VCO}/(N_3*N_4)$). The third effective divider ratio $N_{AOSR}$ associated with generating the ADC OSR clock signal $F_{AOSR}$ is the same as the second divider ratio $N_2$ (e.g., $N_{AOSR}=N_2$). Thus, the frequency of the ADC OSR clock signal $F_{AOSR}$ is the frequency of the VCO clock signal $F_{VCO}$ divided by the second divider ratio $N_2$ (e.g., $F_{AOSR}=F_{VCO}/N_{AOSR}=F_{VCO}/N_2$). In this example, the fourth effective divider ratio $N_{LO}$ associated with generating the LO clock signal $F_{LO}$ is the same as the third divider ratio $N_3$. Thus, the frequency of the LO clock signal $F_{LO}$ is the frequency of the VCO clock signal $F_{VCO}$ divided by the third divider ratio $N_3$ (e.g., $F_{LO}=F_{VCO}/N_{LO}=F_{VCO}/N_3$).

Figures 6, 7:
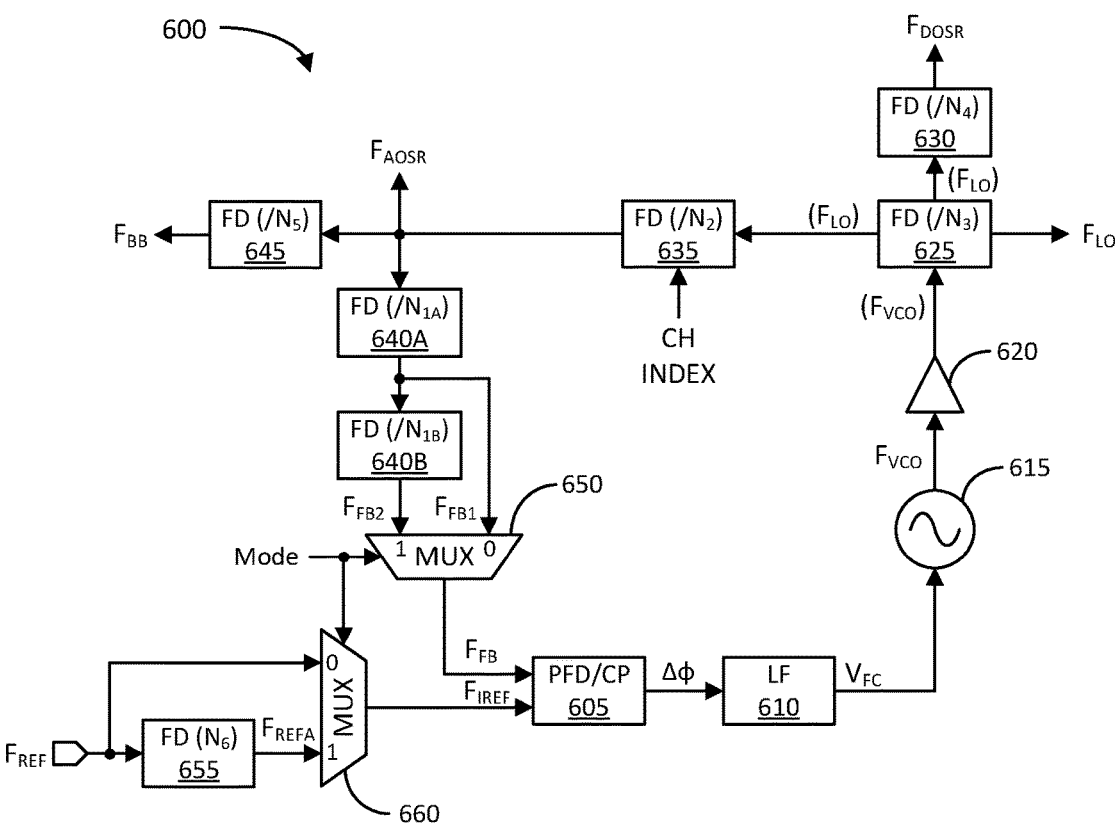
FIG. 6 illustrates a block diagram of another example clock signal synthesizer in accordance with another aspect of the disclosure.
FIG. 7 illustrates a table depicting example clock signal frequencies and parameters associated with the clock signal synthesizer of FIG. 6 in accordance with another aspect of the disclosure.

FIG. 6 illustrates a block diagram of another example clock signal synthesizer 600 in accordance with another aspect of the disclosure. The clock signal synthesizer 600 may be another example detailed implementation of the clock signal synthesizer 390 of UWB transceiver 300. In particular, the clock signal synthesizer 600 includes a phase-frequency detector/charge pump (PFD/CP) 605, a loop filter (LF) 610, a voltage controlled oscillator (VCO) 615, a buffer 620, a set (e.g., pair) of first frequency dividers (FDs) 640A and 640B, a second frequency divider (FD) 635, a third frequency divider (FD) 625, a fourth frequency divider (FD) 630, a fifth frequency divider (FD) 645, a sixth frequency divider (FD) 655, a first multiplexer 650, and a second multiplexer 660. The PFD/CP 605, the LF 610, the VCO 615, the buffer 620, the third frequency divider (FD) 625, the second frequency divider (FD) 635, the frequency divider (FD) 640A of the set, optionally the frequency divider (FD) 640B of the set, and the first multiplexer 650 are part of a phase-locked loop (PLL) of the clock signal synthesizer 600. As in the previous implementation, the PLL may be implemented as a digital PLL, analog PLL, hybrid digital-analog PLL, DLL, or other phase locking control circuit.

The PFD/CP 605 is configured to generate a phase difference signal $\Delta\phi$ based on a phase/frequency difference between an input reference clock signal $F_{IREF}$ and a phase-locked loop (PLL) feedback clock signal $F_{FB}$. Although, for ease of description, the PFD/CP 405 is described and represented as a single element, it shall be understood that the PFD/CP 605 may include a PFD separate from a CP (e.g., the CP follows the PFD). The loop filter (LF) 610 is configured to filter the phase difference signal $\Delta\phi$ to generate a VCO frequency control signal $V_{FC}$. The VCO 615 is configured to generate a VCO clock signal $F_{VCO}$ based on the frequency control signal $V_{FC}$. As previously discussed, the VCO 615 may alternatively be an ICO or DCO. The buffer 620 is configured to buffer the VCO 615 while also outputting the VCO clock signal $F_{VCO}$.

The third frequency divider 625 is configured to frequency divide the VCO clock signal $F_{VCO}$ by a third divider ratio $N_3$ to generate, for example, the LO clock signal $F_{LO}$ of the UWB transceiver 300 (e.g., $F_{LO}=F_{VCO}/N_3$). The fourth frequency divider 630 is configured to frequency divide the LO clock signal $F_{LO}$ by a fourth divider ratio $N_4$ to generate, for example, the DAC OSR clock signal $F_{DOSR}$ of the UWB transceiver 300 (e.g., $F_{DOSR}=F_{LO}/N_4$). The second frequency divider 635 is configured to frequency divide the LO clock signal $F_{LO}$ by a programmable second divider ratio $N_2$ to generate, for example, the ADC OSR clock signal $F_{AOSR}$ of the UWB transceiver 300 (e.g., $F_{AOSR}=F_{LO}/N_2$). The second frequency divider 635 may set the programmable second divider ratio $N_2$ based on a channel index signal, as previously discussed. The fifth frequency divider 645 is configured to frequency divide the ADC OSR clock signal $F_{AOSR}$ by a fifth divider ratio $N_5$ to generate the baseband clock signal $F_{BB}$ of the UWB transceiver 300 (e.g., $F_{BB}=F_{AOSR}/N_5$).

The frequency divider 640A of the set is configured to frequency divide the ADC OSR clock signal $F_{AOSR}$ by a divider ratio $N_{1A}$ to generate, for example, a first candidate PLL feedback clock signal $F_{FB1}$ (e.g., $F_{FB}1=F_{AOSR}/N_1$). The frequency divider 640B of the first set is configured to frequency divide the first candidate PLL feedback clock signal $F_{FB1}$ by a divider ratio $N_{1B}$ to generate, for example, a second candidate PLL feedback clock signal $F_{FB2}$ (e.g., $F_{FB}2=F_{AOSR}/(N_{1A}*N_{1B})$). The first multiplexer 650 is configured to output either the first candidate PLL feedback clock signal $F_{FB1}$ or the second candidate PLL feedback clock signal $F_{FB2}$ as the PLL feedback clock signal $F_{FB}$ based on a mode signal. For example, if the mode signal is a logic zero (0), the first multiplexer 650 outputs the first candidate PLL feedback clock signal $F_{FB1}$ as the PLL feedback signal $F_{FB}$. If the mode signal is a logic one (1), the first multiplexer 650 outputs the second candidate PLL feedback clock signal $F_{FB2}$ as the PLL feedback signal $F_{FB}$.

The sixth frequency divider 655 is configured to frequency divide a reference clock signal $F_{REF}$ by a sixth divider ratio $N_6$ to generate an alternative reference clock signal $F_{REFA}$ (e.g., $F_{REFA}=F_{REF}/N_6$). The second multiplexer 660 is configured to output either the reference clock signal $F_{REF}$ or the alternative reference clock signal $F_{REFA}$ as the input reference clock signal $F_{IREF}$ for the PLL based on the mode signal. For example, if the mode signal is a logic zero (0), the second multiplexer 660 outputs the reference clock signal $F_{REF}$ as the input reference clock signal $F_{IREF}$. If the mode signal is a logic one (1), the second multiplexer 660 outputs the alternative reference clock signal $F_{REFA}$ as the input reference clock signal $F_{IREF}$.

In this example implementation, the first effective divider ratio $N_{BB}$ associated with generating the baseband clock signal $F_{BB}$ is the product of the fifth divider ratio $N_5$, second divider ratio $N_2$ and the third divider ratio $N_3$ (e.g., $N_{BB}=N_5*N_2*N_3$). Thus, the frequency of the baseband clock signal $F_{BB}$ is the frequency of the VCO clock signal $F_{VCO}$ divided by the product of the fifth, second and third divider ratios $N_5$, $N_2$ and $N_3$ (e.g., $F_{BB}=F_{VCO}/N_{BB}=F_{VCO}/(N_5*N_2*N_3)$). Similarly, the second effective divider ratio $N_{DOSR}$ associated with generating the DAC OSR clock signal $F_{DOSR}$ is the product of the third divider ratio $N_3$ and the fourth divider ratio $N_4$ (e.g., $N_{OSR}=N_3*N_4$). Thus, the frequency of the DAC OSR clock signal $F_{DOSR}$ is the frequency of the VCO clock signal $F_{VCO}$ divided by the product of the third and fourth divider ratios $N_3$ and $N_4$ (e.g., $F_{DOSR}=F_{VCO}/N_{DOSR}=F_{VCO}/(N_3*N_4)$). The third effective divider ratio $N_{AOSR}$ associated with generating the ADC OSR clock signal $F_{AOSR}$ is the product of the second divider ratio $N_2$ and the third divider ratio $N_3$ (e.g., $N_{AOSR}=N_2*N_3$). Thus, the frequency of the ADC OSR clock signal $F_{AOSR}$ is the frequency of the VCO clock signal $F_{VCO}$ divided by the product of the second and third divider ratios $N_2$ and $N_3$ (e.g., $F_{AOSR}=F_{VCO}/N_{AOSR}=F_{VCO}/(N_2*N_3)$). In this example, the fourth effective divider ratio $N_{LO}$ associated with generating the LO clock signal $F_{LO}$ is the same as the third divider ratio $N_3$. Thus, the frequency of the LO clock signal $F_{LO}$ is the frequency of the VCO clock signal $F_{VCO}$ divided by the third divider ratio $N_3$ (e.g., $F_{LO}=F_{VCO}/N_{LO}=F_{VCO}/N_3$).

FIG. 7 illustrates a table depicting example clock frequencies and parameters associated with the clock signal synthesizer 600 in accordance with another aspect of the disclosure. The table is divided into 12 columns, which identify, from left-to-right, a channel index, the frequency of the VCO clock signal $F_{VCO}$ in MHz, the frequency of the LO clock signal $F_{LO}$ in MHz, the frequency of the DAC OSR clock signal $F_{DOSR}$ in MHz, the second divider ratio $N_2$, the frequency of the ADC OSR clock signal $F_{AOSR}$ in MHz, the fifth divider ratio $N_5$, the frequency of the baseband clock signal $F_{BB}$ in MHz, the divider ratio $N_{1A}$, the divider ratio $N_{1B}$, the sixth divider ratio $N_6$, and the frequency of the input reference clock signal $F_{IREF}$, respectively. The table is also divided into four (4) rows (excluding the header row) to specify the aforementioned frequency and divider ratio parameters for a set of channel indices 13-16, respectively.

Considering channel index 13, the frequency of the VCO clock signal $F_{VCO}$ may be 12979.2 MHz (e.g., $F_{VCO}=N_{1A}*N_2*N_3*F_{IREF}$ or $F_{VCO}=N_{1A}*N_{1B}*N_2*N_3*F_{IREF}$), the frequency of the LO clock signal $F_{LO}$ may be 6489.6 MHz (e.g., $F_{LO}=F_{VCO}/N_3$, where $N_3$ is equal to two (2)), the frequency of the DAC OSR clock signal $F_{DOSR}$ may be 3244.8 MHz (e.g., $F_{DOSR}=F_{VCO}/(N_3*N_4)$, where $N_4$ is equal to two (2)), the programmable second divider ratio $N_2$ may be 6.5, the frequency of the ADC OSR clock signal $F_{AOSR}$ may be 998.4 MHz (e.g., $F_{AOSR}=F_{VCO}/(N_2*N_3)$), the fifth divider ratio $N_5$ may be two (2), and the frequency of the baseband clock signal $F_{BB}$ may be fixed at 499.2 MHz for all channels 13-16 ($F_{BB}=F_{VCO}/(N_5*N_2*N_3)$), respectively. Additionally, the divider ratio $N_{1A}$ (with the divider ratios $N_{1B}$ and $N_6$ being bypassed by multiplexers 650 and 660 in response to the mode signal being a logic zero (0)) may be 26 or 13 for an input reference clock signal $F_{IREF}$ with a frequency of 38.4 or 76.8 MHz, respectively; or the divider ratios $N_{1A}$, $N_{1B}$ and $N_6$ may be 13, 4, and 5 for an input reference clock signal $F_{IREF}$ with a frequency of 96 MHz (when the mode signal is a logic one (1)), respectively.

Considering channel index 14, the frequency of the VCO clock signal $F_{VCO}$ may be 13977.6 MHz (e.g., $F_{VCO}=N_1*N_2*N_3*F_{IREF}$ or $F_{VCO}=N_{1A}*N_{1B}*N_2*N_3*F_{IREF}$), the frequency of the LO clock signal $F_{LO}$ may be 6988.8 MHz (e.g., $F_{LO}=F_{VCO}/N_3$, where $N_3$ is equal to two (2)), the frequency of the DAC OSR clock signal $F_{DOSR}$ may be 3494.4 MHz (e.g., $F_{DOSR}=F_{VCO}/(N_3*N_4)$, where $N_4$ is equal to two (2)), the programmable second divider ratio $N_2$ may be seven (7), the frequency of the ADC OSR clock signal $F_{AOSR}$ may be 998.4 MHz (e.g., $F_{AOSR}=F_{VCO}/(N_2*N_3)$), the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$). Additionally, the divider ratio $N_{1A}$ (with the divider ratios $N_{1B}$ and $N_6$ being bypassed by multiplexers 650 and 660 in response to the mode signal being a logic zero (0)) may be 26 or 13 for an input reference clock signal $F_{IREF}$ with a frequency of 38.4 or 76.8 MHz, respectively; or the divider ratios $N_{1A}$, $N_{1B}$ and $N_6$ may be 13, 4, and 5 for an input reference clock signal $F_{IREF}$ with a frequency of 96 MHz (when the mode signal is a logic one (1)), respectively.

Considering channel index 15, the frequency of the VCO clock signal $F_{VCO}$ may be 14976 MHz (e.g., $F_{VCO}=N_1*N_2*N_3*F_{IREF}$ or $F_{VCO}=N_{1A}*N_{1B}*N_2*N_3*F_{IREF}$), the frequency of the LO clock signal $F_{LO}$ may be 7488 MHz (e.g., $F_{LO}=F_{VCO}/N_3$, where $N_3$ is equal to two (2)), the frequency of the DAC OSR clock signal $F_{DOSR}$ may be 3744 MHz (e.g., $F_{DOSR}=F_{VCO}/(N_3*N_4)$, where $N_4$ is equal to two (2)), the programmable second divider ratio $N_2$ may be 7.5, the frequency of the ADC OSR clock signal $F_{AOSR}$ may be 998.4 MHz (e.g., $F_{AOSR}=F_{VCO}/(N_2*N_3)$), the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$). Additionally, the divider ratio $N_{1A}$ (with the divider ratios $N_{1B}$ and $N_6$ being bypassed by multiplexers 650 and 660 in response to the mode signal being a logic zero (0)) may be 26 or 13 for an input reference clock signal $F_{IREF}$ with a frequency of 38.4 or 76.8 MHz, respectively; or the divider ratios $N_{1A}$, $N_{1B}$ and $N_6$ may be 13, 4, and 5 for an input reference clock signal $F_{IREF}$ with a frequency of 96 MHz (when the mode signal is a logic one (1)), respectively.

Considering channel index 16, the frequency of the VCO clock signal $F_{VCO}$ may be 15974.4 MHz (e.g., $F_{VCO}=N_1*N_2*N_3*F_{IREF}$ or $F_{VCO}=N_{1A}*N_{1B}*N_2*N_3*F_{IREF}$), the frequency of the LO clock signal $F_{LO}$ may be 7987.2 MHz (e.g., $F_{LO}=F_{VCO}/N_3$, where $N_3$ is equal to two (2)), the frequency of the DAC OSR clock signal $F_{DOSR}$ may be 3993.6 MHz (e.g., $F_{DOSR}=F_{VCO}/(N_3*N_4)$, where $N_4$ is equal to two (2)), the programmable second divider ratio $N_2$ may be eight (8), the frequency of the ADC OSR clock signal $F_{AOSR}$ may be 998.4 MHz (e.g., $F_{AOSR}=F_{VCO}/(N_2*N_3)$), the fifth divider ratio $N_5$ may be two (2), the frequency of the baseband clock signal $F_{BB}$ may be fixed at 499.2 MHz for all channels 13-16 ($F_{BB}=F_{VCO}/(N_5*N_2*N_3)$). Additionally, the divider ratio $N_{1A}$ (with the divider ratios $N_{1B}$ and $N_6$ being bypassed by multiplexers 650 and 660 in response to the mode signal being a logic zero (0)) may be 26 or 13 for an input reference clock signal $F_{IREF}$ with a frequency of 38.4 or 76.8 MHz, respectively; or the divider ratios $N_{1A}$, $N_{1B}$ and $N_6$ may be 13, 4, and 5 for an input reference clock signal $F_{IREF}$ with a frequency of 96 MHz (when the mode signal is a logic one (1)), respectively.

Figures 8, 9:
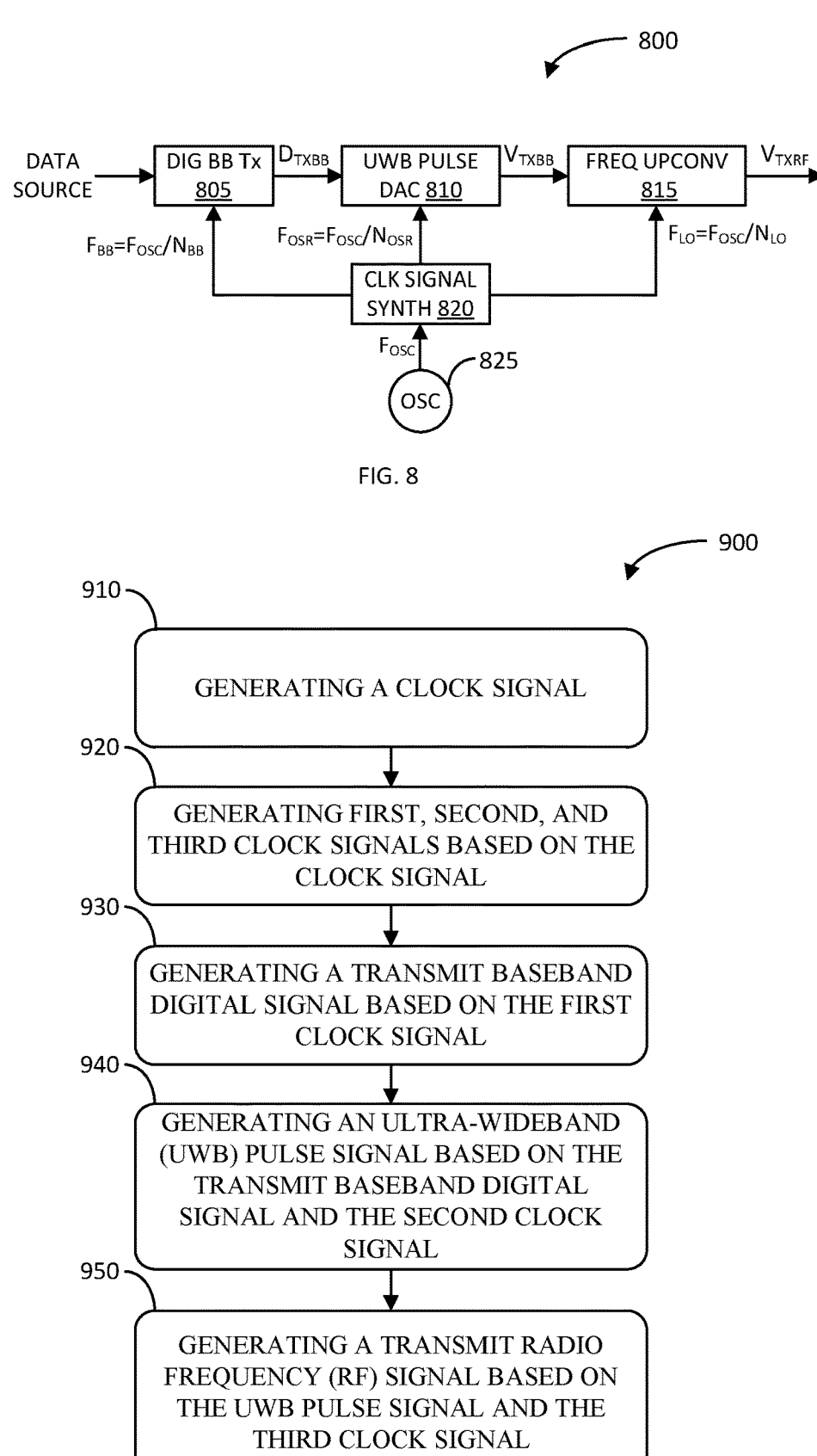
FIG. 8 illustrates a block diagram of an example transmitter in accordance with another aspect of the disclosure.
FIG. 9 illustrates a flow diagram of an example method of generating a transmit radio frequency (RF) signal in accordance with another aspect of the disclosure.

FIG. 8 illustrates a block diagram of an example transmitter 800 in accordance with another aspect of the disclosure. The transmitter 800 includes a clock signal synthesizer 820 configured to generate a baseband clock signal $F_{BB}$, a digital-to-analog converter (DAC) oversampling clock signal $F_{OSR}$, and a local oscillator (LO) clock signal $F_{LO}$. The clock signals $F_{BB}$, $F_{OSR}$, and $F_{LO}$ may be based on a clock signal $F_{OSC}$ generated by an oscillator 825. For example, the frequencies of the clock signals $F_{BB}$, $F_{OSR}$, and $F_{LO}$ may be based on the frequency of the clock signal $F_{OSC}$ in accordance with the following relationships: $F_{BB}=F_{OSC}/N_{BB}$, $F_{OSR}=F_{OSC}/N_{OSR}$, and $F_{LO}=F_{OSC}/N_{LO}$, where the $N_{BB}$, $N_{OSR}$, and $N_{LO}$ are divider ratios.

The transmitter 800 further includes a digital baseband transmitter 805 configured to generate a transmit baseband digital signal $D_{TXBB}$ from data received from a data source in response to the baseband clock signal $F_{BB}$. Additionally, the transmitter 800 includes an ultra-wideband (UWB) pulse digital-to-analog converter (DAC) 810 (e.g., generally an upsampling circuit) configured to generate a UWB pulse signal $V_{TXBB}$ based on the transmit baseband digital signal $D_{TXBB}$ in response to the DAC OSR clock signal $F_{OSR}$. Further, the transmitter 800 includes a frequency upconverter 815 configured to frequency upconvert the UWB pulse signal $V_{TXBB}$ to generate a transmit radio frequency (RF) signal $V_{TXRF}$ based on the LO clock signal $F_{LO}$.

FIG. 9 illustrates a flow diagram of an example method 900 of generating a transmit radio frequency (RF) signal in accordance with another aspect of the disclosure. The method 900 includes generating a clock signal (block 910). Examples of means for generating a clock signal include any of the oscillators (e.g., VCOs, ICOs, DCOs, etc.) or buffers described herein. Additionally, the method 900 includes generating first, second, and third clock signals based on the clock signal (block 920). Examples of means for generating first, second, and third clock signals based on the clock signal include any of the frequency dividers described herein.

Further, the method 900 includes generating a transmit baseband digital signal based on the first clock signal (block 930). Examples of means for generating a transmit baseband digital signal based on the first clock signal include any of the digital baseband transmitters described herein. Also, the method 900 includes generating an ultra-wideband (UWB) pulse signal based on the transmit baseband digital signal and the second clock signal (block 940). Examples of means for generating an ultra-wideband (UWB) pulse signal based on the transmit baseband digital signal and the second clock signal include any of the UWB pulse shaping circuits and DACs described herein.

Additionally, the method 900 includes generating a transmit radio frequency (RF) signal based on the UWB pulse signal and the third clock signal (block 950). Examples of means for generating a transmit radio frequency (RF) signal based on the UWB pulse signal and the third clock signal include any of the frequency upconverters described herein.

The following provides an overview of aspects of the present disclosure:

Aspect 1: An apparatus, comprising: an oscillator configured to generate a clock signal; a clock signal synthesizer configured to generate a first clock signal, a second clock signal, and a third clock signal, wherein the first, second, and third clock signals are based on the clock signal; a baseband transmitter configured to generate a transmit baseband digital signal in response to the first clock signal; an ultra-wideband (UWB) pulse digital-to-analog converter (DAC) configured to generate a UWB pulse signal based on the transmit baseband digital signal in response to the second clock signal; and a frequency upconverter configured to frequency upconvert the UWB pulse signal to generate a transmit radio frequency (RF) signal based on the third clock signal.

Aspect 2: The apparatus of aspect 1, wherein the clock signal synthesizer comprises a phase-locked loop (PLL) including the oscillator configured to generate the clock signal.

Aspect 3: The apparatus of aspect 2, wherein the oscillator comprises a voltage controlled oscillator (VCO) configured to generate the clock signal.

Aspect 4: The apparatus of aspect 2 or 3, wherein the clock signal synthesizer further comprises a first frequency divider configured to frequency divide the clock signal by a first divider ratio to generate the third clock signal.

Aspect 5: The apparatus of any one of aspects 2-4, wherein the PLL further comprises a second frequency divider configured to frequency divide the third clock signal by a second divider ratio to generate the first clock signal.

Aspect 6: The apparatus of aspect 5, wherein the second divider ratio is programmable.

Aspect 7: The apparatus of aspect 6, wherein the second divider ratio is programmable based on a channel index signal.

Aspect 8: The apparatus of any one of aspects 4-7, further comprising an analog-to-digital converter (ADC) configured to generate a received digital baseband signal based on a received analog baseband signal in response to a fourth clock signal, wherein the fourth clock signal is based on the clock signal.

Aspect 9: The apparatus of aspect 8, wherein the PLL further comprises: a second frequency divider configured to frequency divide the third clock signal by a programmable second divider ratio to generate the fourth clock signal; a third frequency divider configured to frequency divide the fourth clock signal by a third divider ratio to generate a fifth clock signal; a phase-frequency detector and a charge pump configured to generate a phase difference signal based on the fifth clock signal and a reference clock signal; a filter configured to generate a frequency control signal based on the phase difference signal; and a voltage controlled oscillator (VCO) configured to generate the clock signal based on the frequency control signal.

Aspect 10: The apparatus of any one of aspects 1-9, wherein the clock signal synthesizer further comprises a fourth frequency divider configured to frequency divide the third clock signal by a fourth divider ratio to generate the second clock signal.

Aspect 11: The apparatus of aspect 8 or 10, wherein the PLL further comprises: a second frequency divider configured to frequency divide the third clock signal by a programmable second divider ratio to generate the fourth clock signal; a third frequency divider configured to frequency divide the fourth clock signal by a third divider ratio to generate a fifth clock signal; a fourth frequency divider configured to frequency divide the fifth clock signal by a fourth divider ratio to generate a sixth clock signal; a first multiplexer configured to output the fifth clock signal or the sixth clock signal based on a mode signal; a phase-frequency detector and a charge pump configured to generate a phase difference signal based on the fifth or sixth clock signal and a first reference clock signal; a filter configured to generate a frequency control signal based on the phase difference signal; and a voltage controlled oscillator (VCO) configured to generate the clock signal based on the frequency control signal.

Aspect 12: The apparatus of aspect 11, wherein the clock signal synthesizer further comprises a fifth frequency divider configured to frequency divide the third clock signal by a fifth divider ratio to generate the second clock signal.

Aspect 13: The apparatus of aspect 11 or 12, wherein the clock signal synthesizer further comprises: a fifth frequency divider configured to frequency divide a second reference clock signal by a fifth divider ratio to generate a third reference clock signal; and a second multiplexer configured to output the second reference clock signal or the third reference clock signal as the first reference clock signal based on the mode signal.

Aspect 14: The apparatus of any one of aspects 1-13, further comprising: at least one antenna; and a radio frequency (RF) front end configured to process the transmit RF signal for wireless transmission via the at least one antenna.

Aspect 15: The apparatus of any one of aspects 1-14, further comprising a frequency downconverter configured to frequency downconvert a received radio frequency (RF) signal to generate a received baseband signal based on the third clock signal.

Aspect 16: The apparatus of aspect 15, further comprising: at least one antenna; and a radio frequency (RF) front end configured to process a signal wirelessly received via the at least one antenna to generate the received RF signal.

Aspect 17: The apparatus of aspect 15 or 16, further comprising a baseband analog-to-digital converter (ADC) configured to convert the received baseband signal into a digital baseband signal based on a fourth clock signal, wherein the fourth clock signal is based on the clock signal.

Aspect 18: A method, comprising: generating a clock signal; generating first, second, and third clock signals based on the clock signal; generating a transmit baseband digital signal based on the first clock signal; generating an ultra-wideband (UWB) pulse signal based on the transmit baseband digital signal and the second clock signal; and generating a transmit radio frequency (RF) signal based on the UWB pulse signal and the third clock signal.

Aspect 19: The method of aspect 18, wherein generating the third clock signal comprises frequency dividing the clock signal by a first divider ratio to generate the third clock signal.

Aspect 20: The method of aspect 18 or 19, wherein generating the second clock signal comprises frequency dividing the third clock signal by a second divider ratio to generate the second clock signal.

Aspect 21: The method of any one of aspects 18-20, wherein generating the first clock signal comprises frequency dividing the third clock signal by a second divider ratio to generate the first clock signal.

Aspect 22: The method of aspect 21, further comprising programming the second divider ratio.

Aspect 23: The method of aspect 22, wherein programming the second divider ratio comprises programming the second divider ratio based on a channel index signal.

Aspect 24: The method of any one of aspects 18-23, further comprising: converting a received baseband analog signal into a received baseband digital signal in response to a fourth clock signal; frequency dividing the third clock signal by a second divider ratio to generate the fourth clock signal; generating a phase-locked loop (PLL) feedback clock signal based on the fourth clock signal; generating a phase difference signal based on the PLL feedback clock signal and a reference clock signal; generating a frequency control signal based on the phase difference signal; and generating the clock signal based on the frequency control signal.

Aspect 25: The method of any one of aspects 18-23, further comprising: converting a received baseband analog signal into a received baseband digital signal in response to a fourth clock signal; frequency dividing the third clock signal by a second divider ratio to generate the fourth clock signal; generating a first candidate phase-locked loop (PLL) feedback clock signal based on the fourth clock signal; generating a second candidate PLL feedback clock signal based on the fourth clock signal; selecting the first or second candidate PLL feedback clock signal as a PLL feedback clock signal based on a mode signal; generating a phase difference signal based on the PLL feedback clock signal and an input reference clock signal; generating a frequency control signal based on the phase difference signal; and generating the clock signal based on the frequency control signal.

Aspect 26: The method of aspect 25, further comprising: receiving a first reference clock signal; generating a second reference clock signal based on the first reference clock signal; and selecting the first or second reference clock signal as the input reference clock signal based on the mode signal.

Aspect 27: The method of any one of aspects 18-23, further comprising converting a received baseband analog signal into a received baseband digital signal based on a fourth clock signal, wherein the fourth clock signal is based on the clock signal.

Aspect 28: The method of aspect 27, further comprising frequency downconverting a received radio frequency (RF) signal into the received baseband analog signal based on the third clock signal.

Aspect 29: An apparatus, comprising: means for generating a clock signal; means for generating first, second, and third clock signals based on the clock signal; means for generating a transmit baseband digital signal based on the first clock signal; means for generating an ultra-wideband (UWB) pulse signal based on the transmit baseband digital signal and the second clock signal; and means for generating a transmit radio frequency (RF) signal based on the UWB pulse signal and the third clock signal.

Aspect 30: An apparatus, comprising: an oscillator configured to generate a clock signal; a first frequency divider configured to frequency divide the clock signal by a first divider ratio to generate a local oscillator (LO) clock signal; a second frequency divider configured to frequency divide the clock signal or the LO clock signal by a programmable second divider ratio to generate a first oversampling clock signal; a third frequency divider configured to frequency divide the first oversampling clock signal by a third divider ratio to generate a baseband clock signal; and a fourth frequency divider configured to frequency divide the LO clock signal by a fourth divider ratio to generate a second oversampling clock signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   an oscillator configured to generate a clock signal;
   a clock signal synthesizer configured to generate a first clock signal, a second clock signal, and a third clock signal, wherein the first, second, and third clock signals are based on the clock signal;
   a baseband transmitter configured to generate a transmit baseband digital signal in response to the first clock signal;
   an ultra-wideband (UWB) pulse digital-to-analog converter (DAC) configured to generate a UWB pulse signal based on the transmit baseband digital signal in response to the second clock signal; and
   a frequency upconverter configured to frequency upconvert the UWB pulse signal to generate a transmit radio frequency (RF) signal based on the third clock signal.

2. The apparatus of claim 1, wherein the clock signal synthesizer comprises a phase-locked loop (PLL) including the oscillator configured to generate the clock signal.

3. The apparatus of claim 2, wherein the oscillator comprises a voltage controlled oscillator (VCO) configured to generate the clock signal.

4. The apparatus of claim 2, wherein the clock signal synthesizer further comprises a first frequency divider configured to frequency divide the clock signal by a first divider ratio to generate the third clock signal.

5. The apparatus of claim 4, wherein the PLL further comprises a second frequency divider configured to frequency divide the third clock signal by a second divider ratio to generate the first clock signal.

6. The apparatus of claim 5, wherein the second divider ratio is programmable.

7. The apparatus of claim 6, wherein the second divider ratio is programmable based on a channel index signal.

8. The apparatus of claim 4, further comprising an analog-to-digital converter (ADC) configured to generate a received digital baseband signal based on a received analog baseband signal in response to a fourth clock signal, wherein the fourth clock signal is based on the clock signal.

9. The apparatus of claim 8, wherein the PLL further comprises:
   a second frequency divider configured to frequency divide the third clock signal by a programmable second divider ratio to generate the fourth clock signal;
   a third frequency divider configured to frequency divide the fourth clock signal by a third divider ratio to generate a fifth clock signal;
   a phase-frequency detector and a charge pump configured to generate a phase difference signal based on the fifth clock signal and a reference clock signal;
   a filter configured to generate a frequency control signal based on the phase difference signal; and a voltage controlled oscillator (VCO) configured to generate the clock signal based on the frequency control signal.

10. The apparatus of claim 9, wherein the clock signal synthesizer further comprises a fourth frequency divider configured to frequency divide the third clock signal by a fourth divider ratio to generate the second clock signal.

11. The apparatus of claim 8, wherein the PLL further comprises:
    a second frequency divider configured to frequency divide the third clock signal by a programmable second divider ratio to generate the fourth clock signal;
    a third frequency divider configured to frequency divide the fourth clock signal by a third divider ratio to generate a fifth clock signal;
    a fourth frequency divider configured to frequency divide the fifth clock signal by a fourth divider ratio to generate a sixth clock signal;
    a first multiplexer configured to output the fifth clock signal or the sixth clock signal based on a mode signal;
    a phase-frequency detector and a charge pump configured to generate a phase difference signal based on the fifth or sixth clock signal and a first reference clock signal;
    a filter configured to generate a frequency control signal based on the phase difference signal; and
    a voltage controlled oscillator (VCO) configured to generate the clock signal based on the frequency control signal.

12. The apparatus of claim 11, wherein the clock signal synthesizer further comprises a fifth frequency divider configured to frequency divide the third clock signal by a fifth divider ratio to generate the second clock signal.

13. The apparatus of claim 11, wherein the clock signal synthesizer further comprises:
    a fifth frequency divider configured to frequency divide a second reference clock signal by a fifth divider ratio to generate a third reference clock signal; and
    a second multiplexer configured to output the second reference clock signal or the third reference clock signal as the first reference clock signal based on the mode signal.

14. The apparatus of claim 1, further comprising:
    at least one antenna; and
    a radio frequency (RF) front end configured to process the transmit RF signal for wireless transmission via the at least one antenna.

15. The apparatus of claim 1, further comprising a frequency downconverter configured to frequency downconvert a received radio frequency (RF) signal to generate a received baseband signal based on the third clock signal.

16. The apparatus of claim 15, further comprising:
    at least one antenna; and
    a radio frequency (RF) front end configured to process a signal wirelessly received via the at least one antenna to generate the received RF signal.

17. The apparatus of claim 15, further comprising a baseband analog-to-digital converter (ADC) configured to convert the received baseband signal into a digital baseband signal based on a fourth clock signal, wherein the fourth clock signal is based on the clock signal.

18. A method, comprising:
    generating a clock signal;
    generating first, second, and third clock signals based on the clock signal;
    generating a transmit baseband digital signal based on the first clock signal;

generating an ultra-wideband (UWB) pulse signal based on the transmit baseband digital signal and the second clock signal; and generating a transmit radio frequency (RF) signal based on the UWB pulse signal and the third clock signal.

19. The method of claim 18, wherein generating the third clock signal comprises frequency dividing the clock signal by a first divider ratio to generate the third clock signal.

20. The method of claim 19, wherein generating the second clock signal comprises frequency dividing the third clock signal by a second divider ratio to generate the second clock signal.

21. The method of claim 19, wherein generating the first clock signal comprises frequency dividing the third clock signal by a second divider ratio to generate the first clock signal.

22. The method of claim 21, further comprising programming the second divider ratio.

23. The method of claim 22, wherein programming the second divider ratio comprises programming the second divider ratio based on a channel index signal.

24. The method of claim 19, further comprising:

converting a received baseband analog signal into a received baseband digital signal in response to a fourth clock signal;

frequency dividing the third clock signal by a second divider ratio to generate the fourth clock signal;

generating a phase-locked loop (PLL) feedback clock signal based on the fourth clock signal;

generating a phase difference signal based on the PLL feedback clock signal and a reference clock signal;

generating a frequency control signal based on the phase difference signal; and generating the clock signal based on the frequency control signal.

25. The method of claim 19, further comprising:

converting a received baseband analog signal into a received baseband digital signal in response to a fourth clock signal;

frequency dividing the third clock signal by a second divider ratio to generate the fourth clock signal;

generating a first candidate phase-locked loop (PLL) feedback clock signal based on the fourth clock signal;

generating a second candidate PLL feedback clock signal based on the fourth clock signal;

selecting the first or second candidate PLL feedback clock signal as a PLL feedback clock signal based on a mode signal;

generating a phase difference signal based on the PLL feedback clock signal and an input reference clock signal;

generating a frequency control signal based on the phase difference signal; and generating the clock signal based on the frequency control signal.

26. The method of claim 25, further comprising:

receiving a first reference clock signal;

generating a second reference clock signal based on the first reference clock signal; and selecting the first or second reference clock signal as the input reference clock signal based on the mode signal.

27. The method of claim 18, further comprising converting a received baseband analog signal into a received baseband digital signal based on a fourth clock signal, wherein the fourth clock signal is based on the clock signal.

28. The method of claim 27, further comprising frequency downconverting a received radio frequency (RF) signal into the received baseband analog signal based on the third clock signal.

29. An apparatus, comprising:

means for generating a clock signal;

means for generating first, second, and third clock signals based on the clock signal;

means for generating a transmit baseband digital signal based on the first clock signal;

means for generating an ultra-wideband (UWB) pulse signal based on the transmit baseband digital signal and the second clock signal; and means for generating a transmit radio frequency (RF) signal based on the UWB pulse signal and the third clock signal.

30. An apparatus, comprising:

an oscillator configured to generate a clock signal;

a first frequency divider configured to frequency divide the clock signal by a first divider ratio to generate a local oscillator (LO) clock signal;

a second frequency divider configured to frequency divide the clock signal or the LO clock signal by a programmable second divider ratio to generate a first oversampling clock signal;

a third frequency divider configured to frequency divide the first oversampling clock signal by a third divider ratio to generate a baseband clock signal; and a fourth frequency divider configured to frequency divide the LO clock signal by a fourth divider ratio to generate a second oversampling clock signal.

* * * * *